(12) United States Patent
Remillard

(10) Patent No.: US 6,724,326 B1
(45) Date of Patent: Apr. 20, 2004

(54) SYSTEM AND METHOD FOR COMPRESSING AN INTELLIGENCE BEARING SIGNAL AND COMMUNICATING THE COMPRESSED SIGNAL FROM A SOURCE SITE TO A DESTINATION SITE

(75) Inventor: John F. Remillard, Windsor, CA (US)

(73) Assignee: Pathobiotek Inc., Fenton, MI (US)

( * ) Notice: Subject to any disclaimer, the term of this patent is extended or adjusted under 35 U.S.C. 154(b) by 0 days.

(21) Appl. No.: 10/345,834

(22) Filed: Jan. 16, 2003

Related U.S. Application Data

(63) Continuation of application No. 09/934,331, filed on Aug. 17, 2001, now abandoned.

(51) Int. Cl.[7] .................................................. H03M 7/34

(52) U.S. Cl. .......................................... 341/51; 341/50

(58) Field of Search ............................... 341/51, 50, 67

(56) References Cited

U.S. PATENT DOCUMENTS

| 5,442,350 A | * | 8/1995 | Iyer et al. ..................... 341/51 |
| 5,486,826 A | | 1/1996 | Remillard |
| 5,513,298 A | | 4/1996 | Stanford et al. |
| 5,570,455 A | | 10/1996 | Remillard |
| 5,594,435 A | | 1/1997 | Remillard |
| 5,615,296 A | | 3/1997 | Stanford et al. |
| 6,128,338 A | * | 10/2000 | Behaghel et al. ........... 375/240 |

\* cited by examiner

*Primary Examiner*—Brian Young
*Assistant Examiner*—Joseph Lauture
(74) *Attorney, Agent, or Firm*—Akin Gump Strauss Hauer & Feld LLP

(57) ABSTRACT

An intelligence bearing signal in the form of a string of digitized analog signals is communicated from a source site to a destination site. The signal is in the form of a string of digitized analog signal samples. A sub-string dictionary, a linked list and an ID list are provided at the source site and the destination site, and are used to compress the intelligence bearing signal for faster transmission.

16 Claims, 10 Drawing Sheets

SLIST ARRAY

THE WORDS "SYMBOL" AND "SAMPLE" (HEREIN ABBREVIATED AS "S")
MEAN THE SAME THING, WHICH IS THE NUMERIC VALUE OF A SINGLE AMPLITUDE.

$S_1$ MEANS 1st SYMBOL IN THE S-STRING
$S_2$ MEANS 2nd SYMBOL IN THE S-STRING
ETC.

| S-STRING LENGTH | $S_1$ | $S_2$ | $S_3$ | $S_4$ | $S...$ | $S_n$ |
|---|---|---|---|---|---|---|
| S-STRING LENGTH | $S_1$ | $S_2$ | $S_3$ | $S_4$ | $S...$ | $S_n$ |
| S-STRING LENGTH | $S_1$ | $S_2$ | $S_3$ | $S_4$ | $S...$ | $S_n$ |
| S-STRING LENGTH | $S_1$ | $S_2$ | $S_3$ | $S_4$ | $S...$ | $S_n$ |
| S-STRING LENGTH | $S_1$ | $S_2$ | $S_3$ | $S_4$ | $S...$ | $S_n$ |

*Fig. 3*

PLIST ARRAY

| |
|---|
| PRIOR PLIST MEMBER WITH SAME ID |
| ADDRESS POINTER TO S-STRING IN SLIST WITH MATCHING ID |
| NEXT PLIST MEMBER WITH SAME ID |
| PRIOR PLIST MEMBER WITH SAME ID |
| ADDRESS POINTER TO S-STRING IN SLIST WITH MATCHING ID |
| NEXT PLIST MEMBER WITH SAME ID |
| PRIOR PLIST MEMBER WITH SAME ID |
| ADDRESS POINTER TO S-STRING IN SLIST WITH MATCHING ID |
| NEXT PLIST MEMBER WITH SAME ID |
| PRIOR PLIST MEMBER WITH SAME ID |
| ADDRESS POINTER TO S-STRING IN SLIST WITH MATCHING ID |
| NEXT PLIST MEMBER WITH SAME ID |
| ETC. |

*Fig. 4*

IDLIST ARRAY

TABLE ENTRIES (ID PACKETS) ARE VARIABLE LENGTH.
THE LENGTH OF EACH ID PACKET
DEPENDS UPON THE COUNT OF PEAKS.

| |
|---|
| COUNT OF PEAKS (1st PACKET) |
| PRIOR PACKET WITH SAME COUNT OF PEAKS |
| NEXT PACKET WITH SAME COUNT OF PEAKS |
| ADDRESS IN PLIST OF 1st S-STRING POINTER |
| PEAK 1 OFFSET TO START OF S-STRING |
| PEAK 2 OFFSET TO PEAK 1 |
| PEAK 3 OFFSET TO PEAK 2 |
| ETC. |
| PEAK n OFFSET TO PEAK n-1 |
| PEAK 1 AMPLITUDE |
| PEAK 2 AMPLITUDE |
| PEAK 3 AMPLITUDE |
| ETC. |
| PEAK n AMPLITUDE |
| COUNT OF PEAKS (2nd PACKET) |
| PRIOR PACKET WITH SAME COUNT OF PEAKS |
| NEXT PACKET WITH SAME COUNT OF PEAKS |

IDLIST ARRAY (CONT'D)

(CONTINUED FROM FIG. 5A)

| ADDRESS IN PLIST OF 1st S-STRING POINTER |
|---|
| PEAK 1 OFFSET TO START OF S-STRING |
| PEAK 2 OFFSET TO PEAK 1 |
| PEAK 3 OFFSET TO PEAK 2 |
| ETC. |
| PEAK n OFFSET TO PEAK n-1 |
| PEAK 1 AMPLITUDE |
| PEAK 2 AMPLITUDE |
| PEAK 3 AMPLITUDE |
| ETC. |
| PEAK n AMPLITUDE |

*Fig. 5B*

SYSTEM AND METHOD FOR COMPRESSING AN INTELLIGENCE BEARING SIGNAL AND COMMUNICATING THE COMPRESSED SIGNAL FROM A SOURCE SITE TO A DESTINATION SITE

CROSS REFERENCE TO RELATED APPLICATION

This application is a continuation of application Ser. No. 09/934,331, filed Aug. 17, 2001 is now abandoned, entitled "SYSTEM AND METHOD FOR COMPRESSING AN INTELLIGENCE BEARING SIGNAL AND COMMUNICATING THE COMPRESSED SIGNAL FROM A SOURCE SITE TO A DESTINATION SITE," the entire disclosure of which is incorporated herein by reference.

BACKGROUND OF THE INVENTION

Noiseless/lossless data compression greatly increases communication speed and memory capacity without degrading data integrity. One conventional method of lossless data compression used for text compression is called autosophy data communication. In this process, each text word is replaced by a preassigned word-number or address token that is associated with the word. Only the address tokens are communicated from a source site to a destination site. Each of the sites contains identical libraries of words and the corresponding word-number or address token. When a destination site receives a string of address tokens, the destination site uses the library to reconstruct the string of words originally input at the source site. This scheme is simple to implement, but is text-based and has limited compression capability.

Many schemes exist to compress intelligence bearing signals, such as sound or voice. However, there is a significant need for faster schemes to compress intelligence bearing signals, particularly toll-grade speech, so that existing communication media, such as fiber optic telephone cables, can be used more efficiently. The present invention fulfills such a need.

BRIEF SUMMARY OF THE INVENTION

An intelligence bearing signal is communicated from a source site to a destination site. The signal is in the form of a string of digitized analog signal samples. A sub-string dictionary, a linked list and an ID list are provided at the source site and the destination site. The sub-string dictionary has a plurality of entries. Each entry is a unique sub-string having a defined length. The linked list has a plurality of entries. The linked list entries include an address pointer to the start of each sub-string in the sub-string dictionary. The ID list has a plurality of entries. Each entry in the ID list contains the characteristics of each sub-string, and a pointer to the linked list entry that points to the first sub-string entry that has the characteristics of a respective sub-string. In the communication process, a string of digitized analog signal samples are parsed into a plurality of sub-strings. The sub-string dictionary and the ID list are then used to identify any sub-strings in the sub-string dictionary that correspond to any of the sub-strings obtained by the parsing operation. Only the address pointer in the linked list that correspond to any identified sub-strings are communicated from the source site to the destination site.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown.

In the drawings:

FIG. 3 shows a sample SList array in accordance with the present invention;

FIG. 4 shows a sample PList array in accordance with the present invention

FIGS. 5A–5B, taken together, show a sample IDList array in accordance with the present invention.

DETAILED DESCRIPTION OF THE INVENTION

1. Overview of Present Invention

Figure 1:
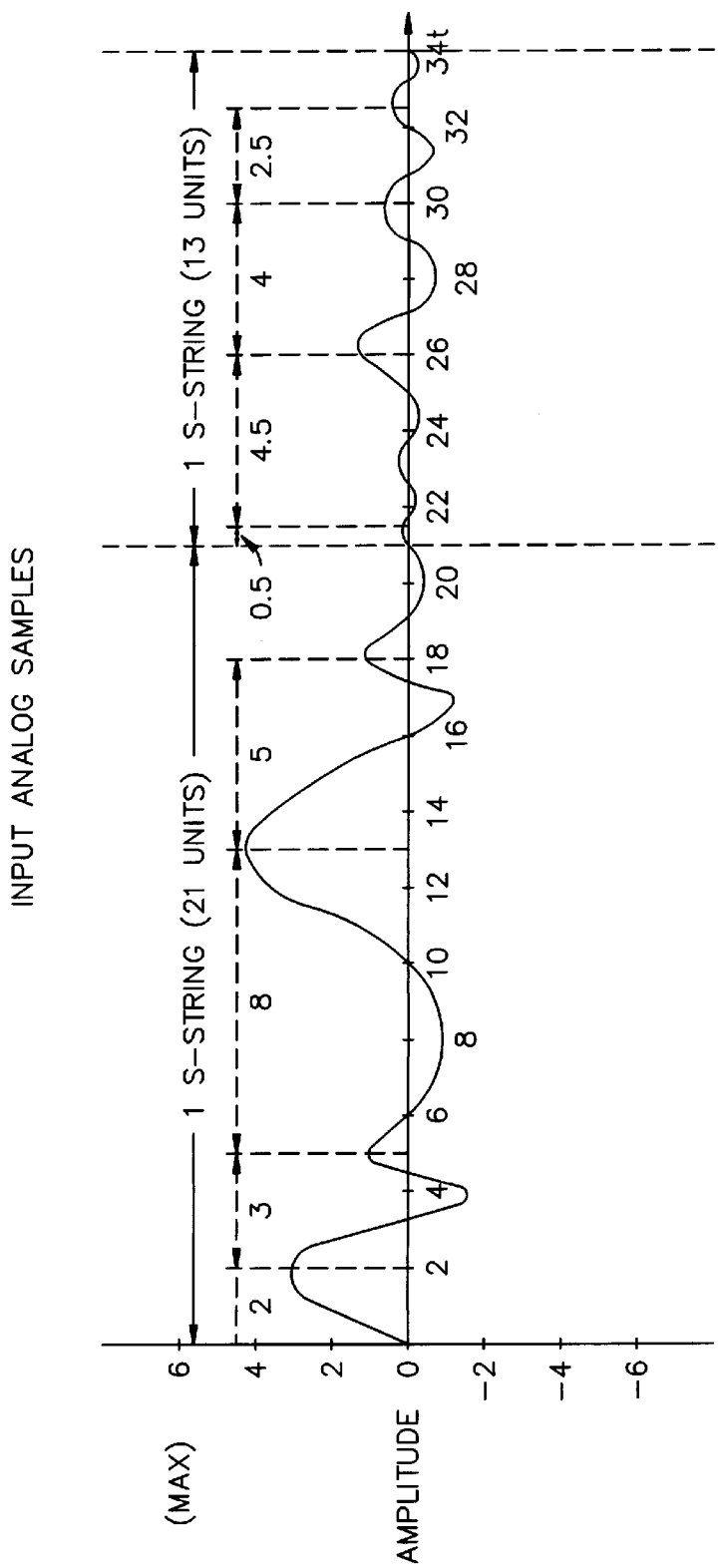
FIG. 1 shows an input analog sample which has been parsed into two sub-strings, in accordance with the present invention.

A string of digitized analog signal samples is broken into sets of variable length sub-strings based upon certain values in the sub-string or characteristics of the sub-string. The digitized analog signals can be or can carry any intelligence information. Examples of such signals include, but are not limited to:

(1) audio, speech, video, broadcast, radio, television, movie (2) measuring or sensory signals, such as EEG, ECG, seismic (3) noise or silence.

The sub-strings are referred to herein as "S-strings." The S-strings, along with a length count, are stored in a dictionary named "SList." Next, a pointer word containing the address of where the S-string entry starts in SList is created and stored into a linked list named "PList." Each time an entry is made in the PList, the link pointers of the PList are updated. Then, an entry is created and stored into a third list, named "IDList." Each IDList entry is a packet that contains the values or variables that identify the characteristics of the S-string, and a pointer to the PList entry that points to the first S-string entry having those values and/or characteristics.

The values and/or characteristics of the S-string that are stored in the IDList include: (1) count of positive peaks, (2) offset to each positive peak, and (3) amplitude of each positive peak.

Before an S-string is added to the SList, a search is done to determine if that S-string is already in the S-List. The S-List does not contain duplicate S-strings.

Copies of SList, PList and IDList can be continuously updated and maintained on multiple devices at different locations throughout the world.

One use of the present invention is to construct a copy of a digitized signal from sets of S-strings. Rather than transmitting a digital signal, the only data needed to construct the copy is one or more PList pointers.

Absent any constraints, it would require an impractical amount of storage to hold all of the possible combinations in an intelligence bearing analog signal. However, certain, if not most, analog signals that carry intelligence information are composed of a very limited number of similar shaped strings, thereby limiting the range of possible combinations. For example, speech is a type of analog signal that is composed from a limited count of similar samples.

Telephone systems capture and store speech via an A/D converter as 8-bit, 8000 samples per second. Although it is numerically possible to represent $2^{64000}$ unique combinations with 8-bits×8000 samples, the nature of speech does not permit that many combinations to exist in the real world. Using the terminology of the present invention, the number of different speech signal S-signals that are actually produced by humans are only a fraction of the potential unique S-signals that could theoretically be generated. The number of unique S-signals is limited by the range of possible physical shapes of the human vocal tract and the limited pronunciation sounds of any given native language. The number of unique S-signals is further limited when only a finite set of users employ the present invention at the same time.

Other types of analog signals also have significantly less unique combinations than the theoretical maximum. Video signals, voiceless music signals, and measuring or sensory signals, such as EEG, ECG signals, also provide only a limited number of S-signals because a large percentage of the data is redundant. In fact, every analog signal bearing intelligible information is limited by the nature of the intelligence information that is being represented.

2. Detailed Description

FIG. 1 shows an input analog sample which has been parsed into two S-strings. Units of amplitude and time are shown to illustrate how the sample is parsed, and how S-strings are defined. The first S-string has a length of t=21 units, and the second S-string has a length of t=13 units. Each S-string also has the following characteristics:

| First S-string: | (a) Count of positive peaks - 4 |
| --- | --- |
| | (b) Offsets to each peak's highest point - 2.0, 3.0, 8.0, 5.0 |
| | (c) Amplitude of each peak's highest point - 2.5, 1.0, 4.0, 1.0 |
| Second S-string | (a) Count of positive peaks - 5 |
| | (b) Offsets to each peak's highest point - 0.5, 4.5, 4.0, 2.5 |
| | (c) Amplitude of each peak's highest point - 0.2, 0.3, 1.0, 0.5, 0.2 |

One preferred embodiment of the present invention is implemented using three 1-dimensional arrays, three types of data packets, three event handlers, and a plurality of subroutine functions.

The three 1-dimensional arrays are:
 (1) SList
 (2) PList
 (3) IDList

The three types of data packets are:
 (1) ID packet
 (2) S-string packet
 (3) Pointer packet The three event handlers are:
 (1) Process Input Analog Signals
 (2) Process Input S-string Packet
 (3) Process Input Pointer Packet The processes that use the present invention call the Event Handlers. The calling process supplies a pointer to the location of the data to be processed by the called Event Handler and the length of the data. The Event Handler returns a pointer to the location of the data produced by the Event Handler. The first word of all variable length data produced by an Event Handler has a count of the length of the data.

Figure 2A:
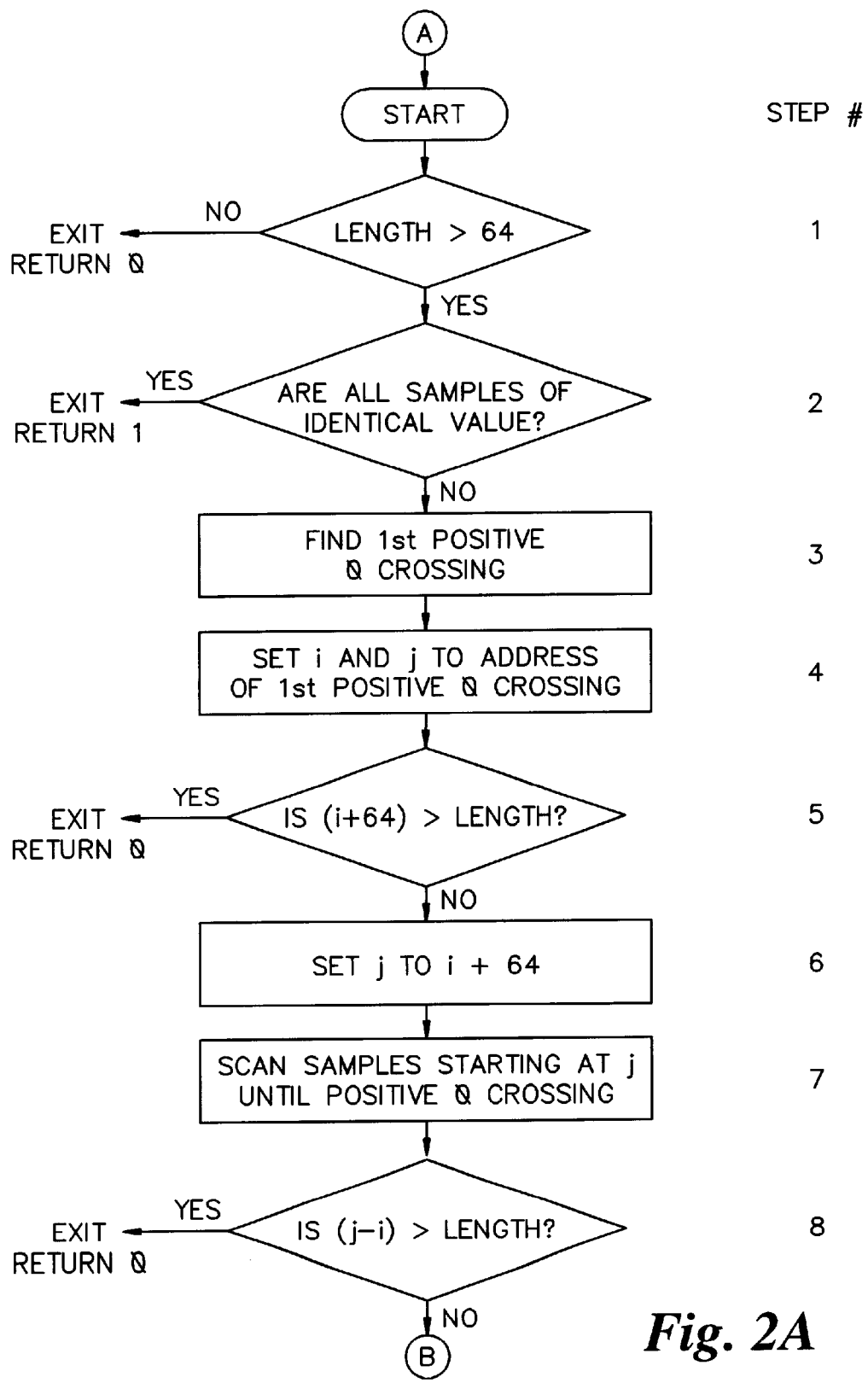
FIGS. 2A–2E are flowcharts of event handlers for implementing the present invention.
Figure 2B:
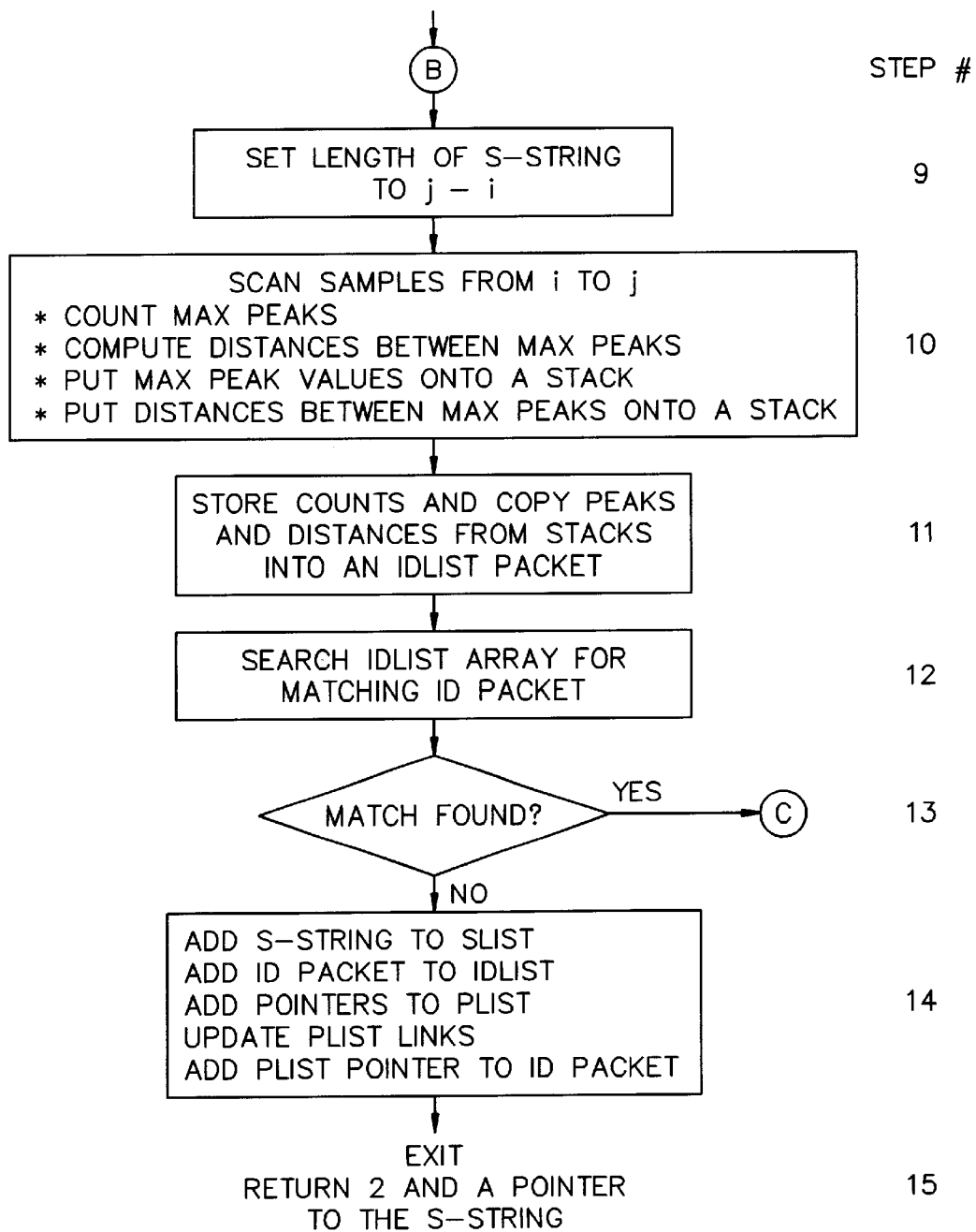
Figure 2C:
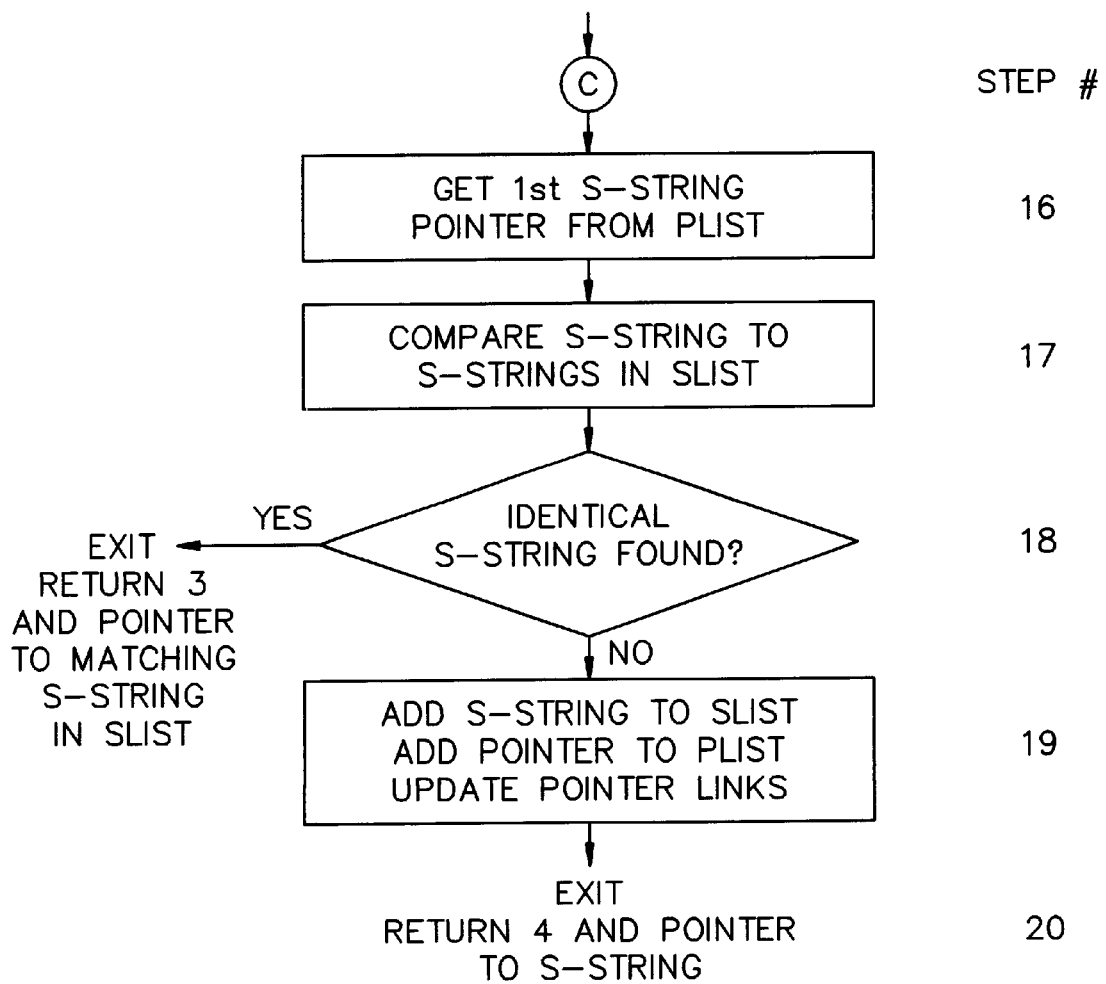
Figure 2D:
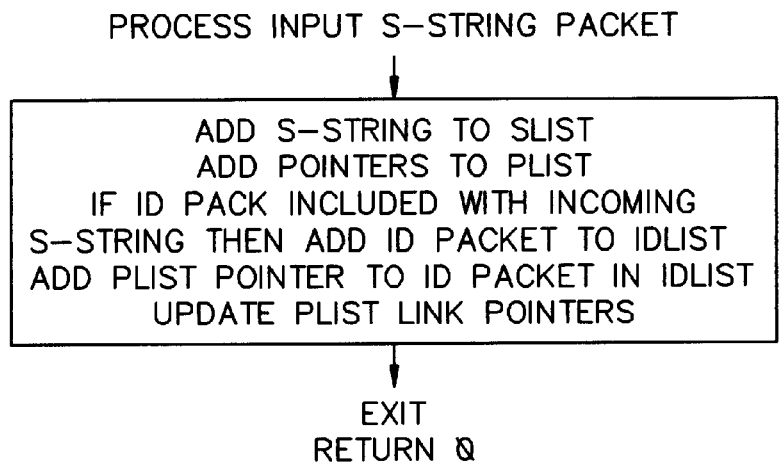
Figure 2E:
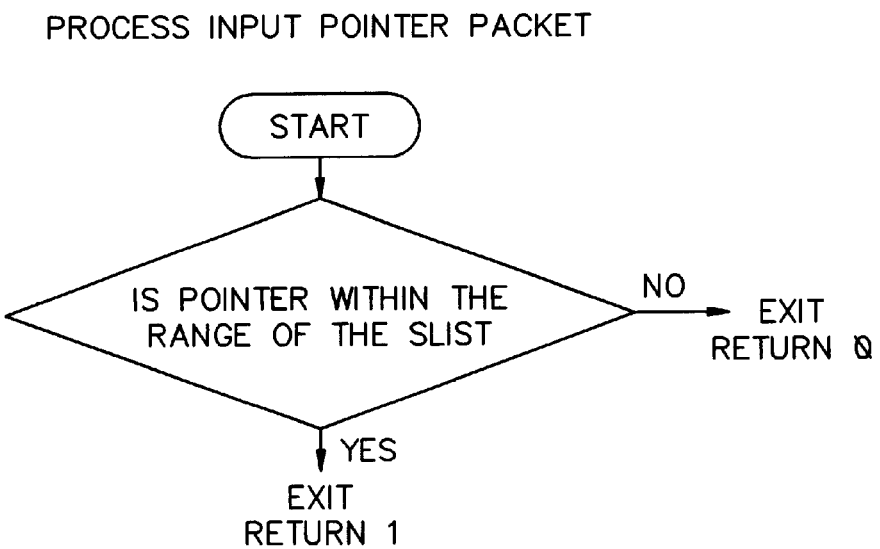

Each event handler uses one or more of the following subroutine functions:
 (1) Find Highest Positive Peaks in S-string
 (2) Compute High Peaks Offset to each Positive Peak
 (3) Add an S-string to SList Array
 (4) Add an IDList Packet to IDList Array
 (5) Update PList Backward/Forward Link Pointers
 (6) Compare an IDList Packet to Packets in IDList Array
 (7) Compare an S-string to S-strings in the SList
 (8) Fuzzy Compare an S-string to S-strings in the SList
 (9) Construct an IDList packet
 (10) Construct an S-string packet
 (11) Construct a Pointer Packet
 (12) Write Analog Samples
 (13) Write S-string Packet
 (14) Write Pointer Packet FIGS. 2A–2E are flowcharts of event handlers for implementing the present invention. The individual steps of the flowcharts are self-explanatory, and thus are not described in detail herein. The return codes associated with the event handlers are defined as follows:

FIGS. 2A–2C: EVENT HANDLER CODES for "PROCESS INPUT ANALOG SIGNALS"
 0=insufficient count of symbols (no encoding has taken place), send string "as is."
 1=all of the symbols in the string are identical.
 2=new string (not on SList), add to SList, send S-string and its PList pointer, and add its values and/or characteristics to the IDList.
 3=S-string is in SList, send PList pointer (pointer address is also returned)
 4=new string (not in SList), add to SList, send S-string and its PList pointer FIG. 2D: EVENT HANDLER CODE for "PROCESS INPUT S-STRING PACKET"
 0=event completed FIG. 2E: EVENT HANDLER CODE for "PROCESS INPUT POINTER PACKET"
 0=not a valid S-string pointer
 1=point is valid FIG. 3 shows a sample SList array.
FIG. 4 shows a sample PList array.
FIGS. 5A–5B, taken together, show a sample IDList array.

By sending only PList pointers over a communication medium, the present invention allows for toll-grade speech to be transmitted (or to appear to be transmitted) at speeds as fast as 4000 bits per second (4 kb/s).

Figure 6:
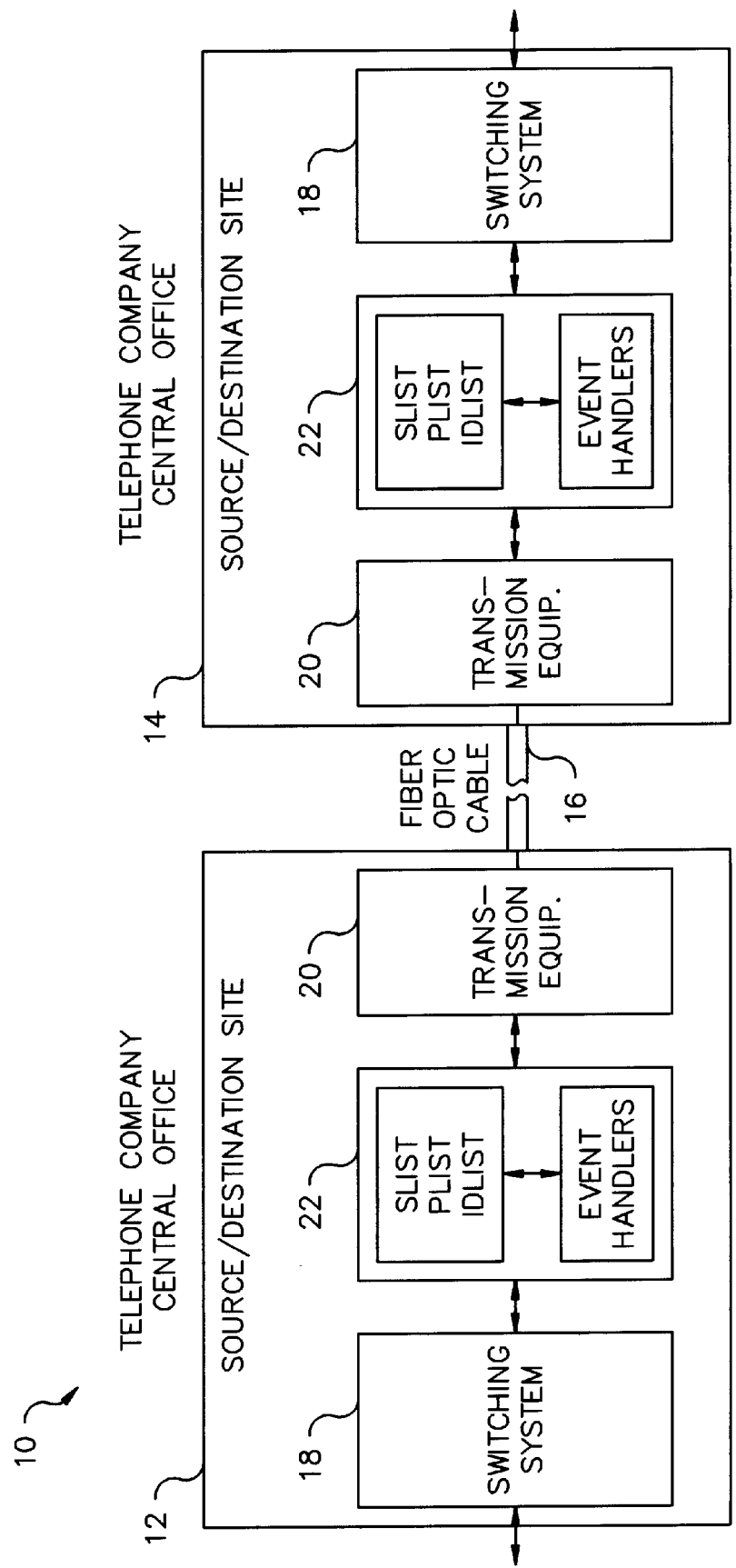
FIG. 6 shows an example of a network that uses the present invention to provide voice communications between source and destination sites.

FIG. 6 shows an example of a network 10 that uses the present invention to provide voice communications between two telephone company central offices 12, 14 connected via a fiber optic cable communication medium 16, such as a submarine cable (e.g., the TransPacific fiber optic telephone cable). Each central office 12, 14 serve as the source and destination sites of the voice signals. Each central office 12, 14 includes a switching system 18 and transmission equipment 20. In one configuration of the present invention, the switching system 18 is a domestic routing box, such as PBX equipment, and the transmission equipment is an international call box comprising DS1 or DS2 cards. In a conventional configuration, the switching system 18 and the transmission equipment 20 would be connected directly together. In FIG. 6, a box 22 is added between the switching system 18 and the transmission equipment 20. The box 22 contains the contents of the present invention, as described above.

The present invention may be implemented with any combination of hardware and software. If implemented as a computer-implemented apparatus, the present invention is implemented using means for performing all of the steps and functions described above.

The present invention can be included in an article of manufacture (e.g., one or more computer program products) having, for instance, computer useable media. The media has embodied therein, for instance, computer readable program code means for providing and facilitating the mechanisms of the present invention. The article of manufacture can be included as part of a computer system or sold separately.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A method of communicating an intelligence bearing analog signal from a source site to a destination site, the signal being in the form of a string of digitized analog signal samples, the method comprising:
   (a) providing at the source site and the destination site
      (i) a sub-string dictionary having a plurality of intelligence-bearing analog signal entries, each entry being a unique sub-string having a defined length,
      (ii) a linked list having a plurality of entries, the entries including an address pointer to the start of each sub-string in the sub-string dictionary, and
      (iii) an ID list having a plurality of entries, each entry containing the characteristics of each sub-string, and a pointer to the linked list entry that points to the first sub-string entry that has the characteristics of a respective sub-string;
   (b) parsing a string of digitized analog signal samples into a plurality of sub-strings;
   (c) using the sub-string dictionary and the ID list to identify any sub-strings in the sub-string dictionary that correspond to any of the sub-strings obtained by the parsing operation, and
   (d) communicating from the source site to the destination site only the address pointer in the linked list that correspond to any identified sub-strings.

2. The method of claim 1 further comprising at the destination site:
   (e) receiving the address pointers; and
   (f) using the linked list and the ID list to reconstruct the signal from the received address pointers.

3. The method of claim 1 wherein if no sub-string in the sub-string dictionary can be identified that corresponds to a sub-string obtained by a parsing operation, then the method further comprises:
   (e) adding the sub-string to the sub-string dictionary, and adding a corresponding entry in the linked list and the ID list.

4. The method of claim 1 wherein the intelligence bearing signal is a speech signal.

5. An apparatus for use in communicating an intelligence bearing analog signal from a source site to a destination site, the signal being in the form of a string of digitized analog signal samples which are parsed into a plurality of sub-strings, the apparatus comprising:
   (a) a sub-string dictionary having a plurality of intelligence-bearing analog signal entries, each entry being a unique sub-string having a defined length;
   (b) a linked list having a plurality of entries, the entries including an address pointer to the start of each sub-string in the sub-string dictionary; and
   (c) an ID list having a plurality of entries, each entry containing the characteristics of each sub-string, and a pointer to the linked list entry that points to the first sub-string entry that has the characteristics of a respective sub-string,
   wherein a signal may be communicated from a source site to a destination site solely by transmitting address pointers in the linked list that correspond to the parsed sub-strings obtained from the signal.

6. The apparatus of claim 5 wherein the characteristics of each sub-string include a count of positive peaks, the offset to each peak's highest point, and the amplitude of each peak's highest point.

7. The apparatus of claim 5 wherein the linked list contains successive entries of an address pointer, the next member with the same ID, and the prior member with the same ID.

8. The apparatus of claim 5 wherein the intelligence bearing signal is a speech signal.

9. An apparatus for compressing an intelligence bearing analog signal, the signal being in the form of a string of digitized analog signal samples which are parsed into a plurality of sub-strings, the apparatus comprising:
   (a) a sub-string dictionary having a plurality of intelligence-bearing analog signal entries, each entry being a unique sub-string having a defined length;
   (b) a linked list having a plurality of entries, the entries including an address pointer to the start of each sub-string in the sub-string dictionary; and
   (c) an ID list having a plurality of entries, each entry containing the characteristics of each sub-string, and a pointer to the linked list entry that points to the first sub-string entry that has the characteristics of a respective sub-string,
   wherein an intelligence bearing signal is compressed by identifying address pointers in the linked list that correspond to parsed sub-strings obtained from the signal, and using the address pointers to represent the sub-strings.

10. The apparatus of claim 9 wherein the characteristics of each sub-string include a count of positive peaks, the offset to each peak's highest point, and the amplitude of each peak's highest point.

11. The apparatus of claim 9 wherein the linked list contains successive entries of an address pointer, the next member with the same ID, and the prior member with the same ID.

12. The apparatus of claim 9 wherein the intelligence bearing signal is a speech signal.

13. A method for compressing an intelligence bearing analog signal, the signal being in the form of a string of digitized analog signal samples which are parsed into a plurality of sub-strings, the method comprising:

(a) providing
- (i) a sub-string dictionary having a plurality of intelligence-bearing analog signal entries, each entry being a unique sub-string having a defined length,
- (ii) a linked list having a plurality of entries, the entries including an address pointer to the start of each sub-string in the sub-string dictionary, and
- (iii) an ID list having a plurality of entries, each entry containing the characteristics of each sub-string, and a pointer to the linked list entry that points to the first sub-string entry that has the characteristics of a respective sub-string;

(b) parsing a string of digitized analog signal samples into a plurality of sub-strings;

(c) using the sub-string dictionary and the ID list to identify any sub-strings in the sub-string dictionary that correspond to any of the sub-strings obtained by the parsing operation; and (d) representing the sub-strings by the respective address pointers, thereby compressing the intelligence bearing signal.

14. The method of claim 13 wherein the characteristics of each sub-string include a count of positive peaks, the offset to each peak's highest point, and the amplitude of each peak's highest point.

15. The method of claim 13 wherein the linked list contains successive entries of an address pointer, the next member with the same ID, and the prior member with the same ID.

16. The method of claim 13 wherein the intelligence bearing signal is a speech signal.

* * * * *